(12) United States Patent
Ding et al.

(10) Patent No.: US 11,107,699 B2
(45) Date of Patent: Aug. 31, 2021

(54) SEMICONDUCTOR MANUFACTURING PROCESS

(71) Applicant: BEIJING NAURA MICROELECTRONICS EQUIPMENT CO., LTD., Beijing (CN)

(72) Inventors: Peijun Ding, Beijing (CN); Bo Zheng, Beijing (CN); Zhenguo Ma, Beijing (CN); Chun Wang, Beijing (CN); Jing Shi, Beijing (CN); Xin Wu, Beijing (CN); Xiaojuan Wang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 16/714,451

(22) Filed: Dec. 13, 2019

(65) Prior Publication Data

US 2020/0118836 A1  Apr. 16, 2020

Related U.S. Application Data

(63) Continuation-in-part of application No. 16/372,659, filed on Apr. 2, 2019, which is a continuation of
(Continued)

(30) Foreign Application Priority Data

Oct. 8, 2016  (CN) .......................... 201610879076.5

(51) Int. Cl.
*H01L 21/383* (2006.01)
*H01L 21/02* (2006.01)
*H01L 21/762* (2006.01)

(52) U.S. Cl.
CPC ........ *H01L 21/383* (2013.01); *H01L 21/0228* (2013.01); *H01L 21/02312* (2013.01); *H01L 21/76243* (2013.01)

(58) Field of Classification Search
None
See application file for complete search history.

(56) References Cited

U.S. PATENT DOCUMENTS 5,030,319 A * 7/1991 Nishino ............ H01L 21/76802
216/87
5,282,925 A * 2/1994 Jeng .................. H01L 21/67069
216/59
(Continued)

FOREIGN PATENT DOCUMENTS

CN        1088272 A     6/1994
CN      101392374 A     3/2009
(Continued)

OTHER PUBLICATIONS

The World Intellectual Property Organization (WIPO) International Search Report and Written Opinion for PCT/CN2017/105368 dated Jan. 12, 2018 6 Pages.

*Primary Examiner* — Allan W. Olsen
(74) *Attorney, Agent, or Firm* — Anova Law Group, PLLC (57) ABSTRACT

A semiconductor manufacturing process is provided. A trench is formed in a semiconductor structure and an oxide layer is deposited on sidewalls of the trench. A solid-state by-product layer is formed on surfaces of the trench by introducing a first etchant gas to react with a naturally occurred oxide layer at the bottom of the trench and the deposited oxide layer. The solid-state by-product layer has a thickness on the bottom less than a thickness on the sidewalls. A second etchant gas is introduced into the trench to react with the solid-state by-product layer, thereby providing (Continued)

a thinned solid-state by-product layer on the sidewalls to protect the deposited oxide layer. By a heating process, the thinned solid-state by-product layer is removed from the sidewalls of the trench, exposing the deposited oxide layer and a surface portion of the semiconductor structure in the trench.

16 Claims, 6 Drawing Sheets

Related U.S. Application Data application No. PCT/CN2017/105368, filed on Oct. 9, 2017.

(56) References Cited

U.S. PATENT DOCUMENTS

| | | | |
|---|---|---|---|
| 5,685,951 A * | 11/1997 | Torek | H01L 21/02063 134/1.3 |
| 2002/0058422 A1 | 5/2002 | Jang et al. | |
| 2010/0093151 A1 | 4/2010 | Arghavani et al. | |
| 2016/0020115 A1 * | 1/2016 | Demichi | H01L 21/0206 438/735 |
| 2020/0102645 A1 * | 4/2020 | Wang | C23C 14/0036 |

FOREIGN PATENT DOCUMENTS

| | | |
|---|---|---|
| CN | 101500935 A | 8/2009 |
| CN | 102376604 A | 3/2012 |
| CN | 104995723 A | 10/2015 |
| TW | 201616577 A | 5/2016 |

* cited by examiner

| Forming a solid-state by-product layer by introducing a first etchant gas to react with a naturally occurred oxide layer at a bottom of a trench in a semiconductor structure and a deposited oxide layer on sidewalls of the trench, where the solid-state by-product layer has a thickness on the bottom less than a thickness on the sidewalls | ← S1002 |
|---|---|
| Introducing a second etchant gas into the trench to react with the solid-state by-product layer on the sidewalls and the bottom, thereby providing a thinned solid-state by-product layer on the sidewalls to protect the deposited oxide layer and removing a portion of the solid-state by-product layer as well as the naturally occurred oxide layer from the bottom of the trench | ← S1004 |
| Removing, by a heating process, the thinned solid-state by-product layer from the sidewalls of the trench, exposing the deposited oxide layer and a surface portion of the semiconductor structure | ← S1006 |

FIG. 10

SEMICONDUCTOR MANUFACTURING PROCESS

CROSS-REFERENCES TO RELATED APPLICATIONS

This application is a continuation-in-part application of U.S. application Ser. No. 16/372,659, filed on Apr. 2, 2019, which is a continuation application of International Application No. PCT/CN2017/105368, filed on Oct. 9, 2017, which claims priority to Chinese Patent Application No. 201610879076.5, filed on Oct. 8, 2016, the entire contents of all of which are incorporated herein by reference.

FIELD OF THE DISCLOSURE

The present disclosure generally relates to the field of integrated circuit fabrication process and, more particularly, relates to a semiconductor manufacturing process.

BACKGROUND

Figure 1:
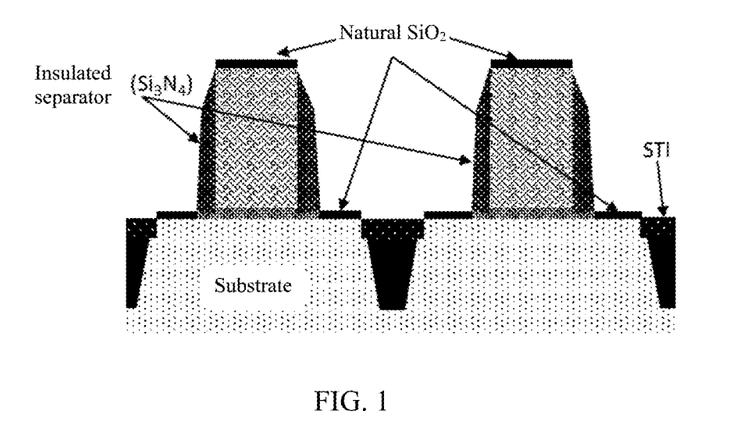
FIG. 1 illustrates a schematic diagram of an exemplary integrated circuit device having a natural oxidation layer.

In the field of integrated circuit (IC) fabrication process, silicon-based materials are often used to fabricate integrated circuits. As shown in FIG. 1, when silicon (or polysilicon) is exposed to air, the silicon may naturally oxidize and a dense layer of silicon dioxide ($SiO_2$) may be formed on a surface of the silicon. In certain processes, a metal thin film may directly contact with a substrate of a silicon material. If a $SiO_2$ layer is present on a surface of the substrate, resistivity may increase, and performance of a fabricated device may decrease. Thus, prior to forming the metal thin film, the $SiO_2$ layer needs to be removed. When removing the $SiO_2$ layer, other films/structures must be protected from being removed or damaged. As shown in FIG. 1, the trench in the 3D NAND (three-dimensional NOT-AND) structure has a very high aspect ratio, often in tens or hundreds. When the naturally formed $SiO_2$ layer at the bottom of the trench is removed, the $SiO_2$ layer formed on the sidewalls of the trench by chemical deposition cannot be removed too much. Otherwise leakage may occur.

The information disclosed in the background section of the specification is merely intended to provide an understanding of the general background of the present disclosure, and is not to be construed in any forms explicitly or implicitly as the existing technology known by those skilled in the art.

BRIEF SUMMARY OF THE DISCLOSURE

One aspect of the present disclosure provides a semiconductor manufacturing process. A trench is formed in a semiconductor structure and an oxide layer is deposited on sidewalls of the trench. A solid-state by-product layer is formed on surfaces of a bottom and the sidewalls of the trench by introducing a first etchant gas to react with a naturally occurred oxide layer at the bottom of the trench and the deposited oxide layer on the sidewalls of the trench. The solid-state by-product layer has a thickness on the bottom less than a thickness on the sidewalls. A second etchant gas is introduced into the trench to react with the solid-state by-product layer on the bottom and the sidewalls, thereby removing the naturally occurred oxide layer and a portion of the solid-state by-product layer from the bottom of the trench and providing a thinned solid-state by-product layer on the sidewalls to protect the deposited oxide layer. By a heating process, the thinned solid-state by-product layer is removed from the sidewalls of the trench, exposing the deposited oxide layer and a surface portion of the semiconductor structure in the trench.

Other aspects of the present disclosure can be understood by those skilled in the art in light of the description, the claims, and the drawings of the present disclosure.

BRIEF DESCRIPTION OF THE DRAWINGS

To more clearly illustrate the technical solution in the present disclosure, the accompanying drawings used in the description of the disclosed embodiments are briefly described hereinafter. The drawings described below are merely some embodiments of the present disclosure. Other drawings may be derived from such drawings by a person with ordinary skill in the art without creative efforts and may be encompassed in the present disclosure. In the embodiments o the present disclosure, a same reference label often refers to a same part.

DETAILED DESCRIPTION

To make the foregoing objectives, features and advantages of the present disclosure clearer and more understandable, the present disclosure will be further described with reference to the accompanying drawings and embodiments. However, exemplary embodiments may be embodied in various forms and should not be construed as limited to the embodiments set forth herein. Rather, these embodiments are provided to fully convey the thorough and complete concepts of the exemplary embodiments to those skilled in the art.

In the existing technology, a plasma etching process is often used to remove the $SiO_2$ layer. In the plasma etching process of removing the $SiO_2$, $NF_3$ and $NH_3$ are mixed to produce a plasma to etch the $SiO_2$. In the etching process, $NF_3$ and $NH_3$ react with the $SiO_2$ to produce $(NH_4)_2SiF_6$ in a chamber. $(NH_4)_2SiF_6$ is in solid state at room temperature. To discharge the solid-state $(NH_4)_2SiF_6$ to the outside of the chamber, the substrate of the silicon-based material is heated to about 120° C. $(NH_4)_2SiF_6$ is sublimated into $SiF_4$, $H_2O$, and $NH_3$ to be discharged to the outside of the chamber. Thus, the plasma etching process of removing $SiO_2$ includes two steps of etching and annealing. After annealing, the substrate of the silicon-based material has a substantially high surface temperature and requires cooling. Therefore, the process is complicated. The two steps of etching and annealing are often performed in a same chamber or may be performed separately in different chambers. The existing equipment for the plasma etching process of removing $SiO_2$ is mainly divided into two types. In one type, a single chamber may be used in both the plasma etching process and the in-situ annealing process. That is, the two steps of etching and annealing are performed in the same chamber. Then, the substrate is cooled in a separate cooling chamber. The equipment may include the etching/annealing chamber and the cooling chamber. In another type, etching and annealing are performed separately. The two steps are performed in different chambers. Correspondingly, the equipment may include the etching chamber, the annealing chamber, and the cooling chamber.

Figure 2:
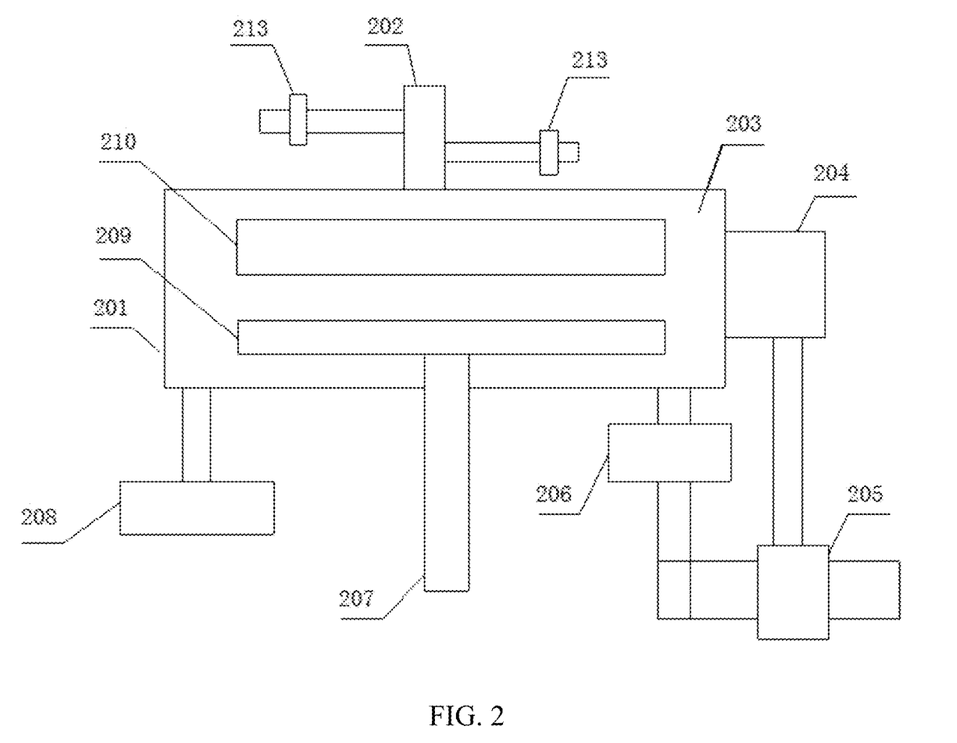
FIG. 2 illustrates a schematic view of an exemplary gas phase etching device according to some embodiments of the present disclosure.

FIG. 2 illustrates a schematic view of an exemplary gas phase etching device according to some embodiments of the present disclosure.

In one embodiment, the gas phase etching device may include a reaction chamber body 201, a pedestal 209, a gas intake 202, and a pressure regulating assembly (not shown). A space enclosed by the reaction chamber body 201 may form a reaction chamber 203. The pedestal 209 may be disposed at a bottom inside the reaction chamber 203 for holding a workpiece to be etched, such as a wafer. The gas intake 202 may be connected to the reaction chamber body 201. Gas etchant may enter the reaction chamber 203 through the gas intake 202. The pressure regulating assembly may be connected to the reaction chamber body 201 for regulating a pressure inside the reaction chamber 203.

Further, the gas phase etching device may include a first temperature regulator 208 and a second temperature regulator 207. The first temperature regulator 208 may be connected to the reaction chamber body 201 for regulating a temperature inside the reaction chamber 203 to a first temperature. At the first temperature, an inner wall of the reaction chamber 203 may not be corroded by the etchants. That is, the first temperature is a temperature under which the reaction chamber 203 may not be corroded. The second temperature regulator 207 may be connected to the pedestal 209 for regulating a temperature of the pedestal 209 to a second temperature. At the second temperature, the workpiece held by the pedestal 209 may satisfy a temperature requirement for directly performing a subsequent step of the method according to the present disclosure. That is, the second temperature is a temperature under which the workpiece held by the pedestal 209 satisfies the temperature requirement for directly performing the subsequent step of the method according to the present disclosure.

The first temperature regulator 208 may regulate the temperature inside the reaction chamber 203 to the first temperature by controlling a gas medium, a liquid medium, or a solid medium in any form of heat conduction, heat radiation, or heat convection. Similarly, the second temperature regulator 207 may regulate the temperature of the pedestal 209 to the second temperature by controlling a gas medium, a liquid medium, or a solid medium in any form of heat conduction, heat radiation, or heat convection.

In one embodiment, through controlling the temperature of the reaction chamber 203 and the temperature of the pedestal 209 holding the workpiece respectively, the subsequent step of the method according to the present disclosure may be performed on the workpiece without being cooled after the removal of the $SiO_2$. In this case, the gas phase etching device only needs to be disposed in an etching chamber without a need to integrating an annealing function into the etching chamber, a need for an additional annealing chamber, or a need for a separate cooling chamber. Thus, problems of requiring multiple chambers in the device for removing the $SiO_2$, which complicates device design, raises production cost and lowers production yield, may be resolved.

Specific structures of the gas phase etching device according to the present disclosure will be described in detail below.

As shown in FIG. 2, in one embodiment, in the gas phase etching device according to the present disclosure, the space defined by the reaction chamber body 201 may form the reaction chamber 203. The pedestal 209 for holding the workpiece may be disposed in a bottom region inside the reaction chamber 203. The gas intake 202 may be connected to the reaction chamber body 201. The gas intake 202 may include a plurality of gas intake pipes. Each gas intake pipe may be configured with a pneumatic valve 213. When the pneumatic valve 213 opens, gas etchants may be mixed in the gas intake 202 before entering the reaction chamber 203 through the gas intake 202.

Further, the gas phase etching device may also include the first temperature regulator 208 and the second temperature regulator 207. The first temperature regulator 208 may be connected to the reaction chamber body 201 for regulating the temperature inside the reaction chamber 203 to the first temperature. At the first temperature, the inner wall of the reaction chamber 203 may not be corroded by the etchants. The second temperature regulator 207 may be connected to the pedestal 209 for regulating the temperature of the pedestal 209 to the second temperature. At the second temperature, the workpiece held by the pedestal 209 may satisfy the temperature requirement for directly performing the subsequent step of the method according to the present disclosure. For example, the temperature regulating mechanism of the first temperature regulator 208 may be specifically a heat exchanger, and the temperature regulating mechanism of the second temperature regulator 207 may be specifically a water cooler. However, it should be understood by those skilled in the art that the present disclosure is not limited thereto, and any method of controlling and regulating the temperature inside the reaction chamber 203 and the temperature of the pedestal 209 may be utilized.

In one embodiment, the first temperature may be approximately between 50° C. and 90° C. The second temperature may be approximately between 20° C. and 60° C. For example, the first temperature may be about 70° C. and the second temperature may be about 40° C. In this case, a relatively high temperature of the reaction chamber 203 may help prevent the inner wall of the reaction chamber 203 from being corroded by the etchants. A relatively low temperature of the pedestal 209 may allow the etchants to react with the $SiO_2$ of the workpiece held by the pedestal 209 at the relatively low temperature, such that neither an annealing chamber nor a cooling chamber is needed. Thus, the cost is saved, the process route is shortened, and the production yield is increased.

In one embodiment, in the gas phase etching device according to the present disclosure, the pressure regulating assembly may be connected to the reaction chamber body 201 for regulating the pressure inside the reaction chamber 203.

In one embodiment, as shown in FIG. 2, the pressure regulating assembly may include a pressure regulator 206 for regulating the pressure inside the reaction chamber 203 to approximately between 30 Torr and 300 Torr, thereby increasing an etching selectivity of the gas phase etching. For example, the pressure inside the reaction chamber 203 may be about 200 Torr. In this case, through regulating the pressure inside the reaction chamber 203, the etchants may react under a high pressure, thereby increasing the etching selectivity and process efficiency.

In one embodiment, the pressure regulating assembly may also include a dry pump 205 and a molecular pump 204. The dry pump 205 may be used to regulate a humidity inside the reaction chamber 203. The molecular pump 204 may be used to extract by-products of the reaction from the reaction chamber 203 after the etching process is completed. The pressure regulator 206, the dry pump 205, and the molecular pump 204 together may form a vacuum system. During the etching process, the pressure regulator 206 may regulate the pressure inside the reaction chamber 203 and the dry pump 205 may regulate the humidity inside the reaction chamber 203. After the etching process is completed, the molecular pump 204 may generate a vacuum inside the reaction chamber 203 (e.g., extracting the by-products of the reaction) for preparing the workpiece for the subsequent process.

Figure 3:
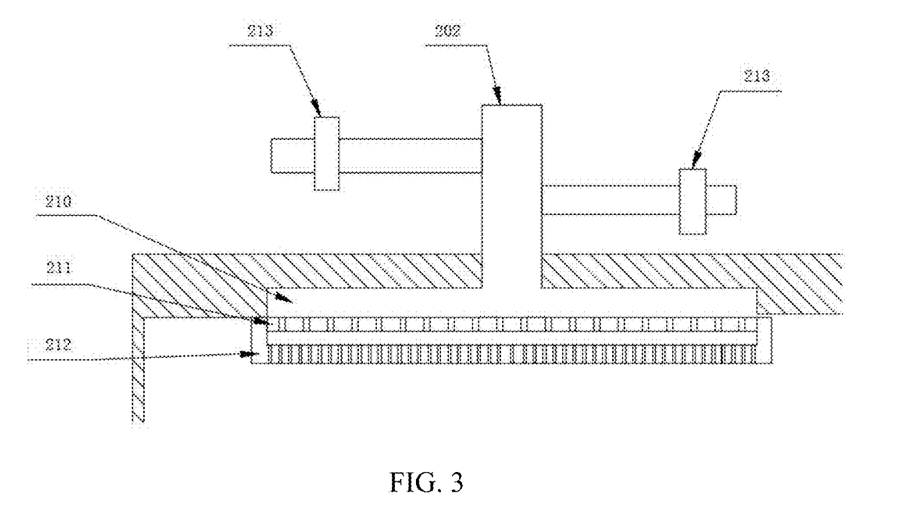
FIG. 3 illustrates a schematic view of a showerhead of an exemplary gas phase etching device according to some embodiments of the present disclosure.

FIG. 3 illustrates a schematic view of a showerhead of an exemplary gas phase etching device according to some embodiments of the present disclosure.

In one embodiment, as shown in FIG. 2 and FIG. 3, the gas phase etching device may also include a showerhead 210. The showerhead 210 may be disposed in an upper region inside the reaction chamber 203 and may be connected to the gas intake 202. The showerhead 210 may be a 2-layer structure, including an upper flow-uniformization plate 211 and a lower flow-uniformization plate 212. From the gas intake 202, the etchants may enter the reaction chamber 203 passing through the upper flow-uniformization plate 211 and the lower flow-uniformization plate 212 of the showerhead 210. The upper flow-uniformization plate 211 and the lower flow-uniformization plate 212 include one or more diffusion trenches. The upper flow-uniformization plate 211 may have a trench diameter greater than a trench diameter of the lower flow-uniformization plate 212.

For example, the gas etchants may first enter a space above the upper flow-uniformization plate 211. When flowing downward, the gas etchants may be blocked by the upper flow-uniformization plate 211 to change a flow direction. That is, the gas etchants may change the flow direction from a vertical downward direction to a horizontal direction. Thus, the upper flow-uniformization plate 211 may make the gas etchants flow more uniformly at a first attempt. That is, the gas etchants in a peripheral region of the upper flow-uniformization plate 211 and the gas etchants in a center region of the upper flow-uniformization plate 211 may reach a preliminary uniform state through a diffusively flowing in the horizontal direction.

Then, the gas etchants may pass through the upper flow-uniformization plate 211 to enter a region above the lower flow-uniformization plate 212. After the gas etchants are blocked by the lower flow-uniformization plate 212, the gas etchants may continue to flow diffusively in the horizontal direction in the region above the lower flow-uniformization plate 212 to reach a more uniform state. Because the trench diameter of the upper flow-uniformization plate 211 is greater than the trench diameter of the lower flow-uniformization plate 212, the gas etchants may rapidly enter the showerhead 210 but discharge slowly out of the showerhead 210. The gas etchants may diffuse thoroughly in the showerhead 210 to reach the uniform state before passing through the lower flow-uniformization plate 212 under a relatively high pressure. Thus, the high-pressure requirement of the reaction chamber 203 is satisfied. The trench diameter of the lower flow-uniformization plate 212 may be smaller than about 1 mm. For example, the trench diameter of the lower flow-uniformization plate 212 may be about 0.5 mm.

Figure 4A:
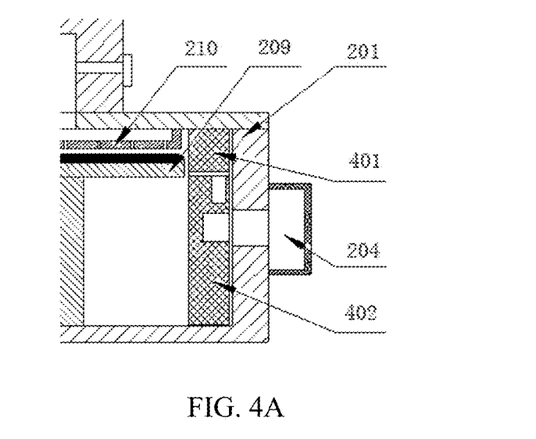
FIG. 4A and FIG. 4B illustrate schematic views of a liner assembly of an exemplary gas phase etching device according to some embodiments of the present disclosure.
Figure 4B:
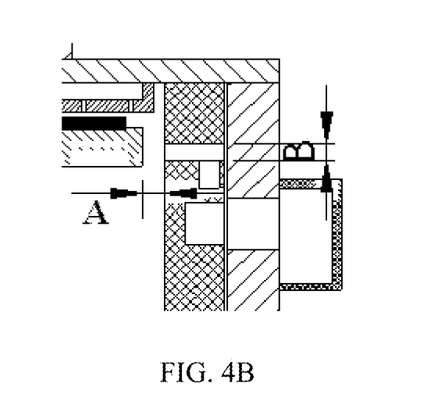

FIG. 4A and FIG. 4B illustrate schematic views of a liner assembly of an exemplary gas phase etching device according to some embodiments of the present disclosure.

In one embodiment, as shown in FIG. 4A and FIG. 4B, the gas phase etching device may also include a liner assembly. The liner assembly may be disposed inside the reaction chamber body 201 (i.e., inside the reaction chamber 203) and may cover sidewalls of the reaction chamber body 201. The liner assembly may include a first liner 401 and a second liner 402. The by-products of the reaction may pass through a gap A between the pedestal 209 and the first liner 401, a gap B between the first liner 401 and the second liner 402, and a gap between the second liner 402 and the reaction chamber body 201 to enter the molecular pump 204 of the pressure regulating assembly.

Liner structures inside the reaction chamber 203 may prevent the gas etchants from corroding the reaction chamber 203 to produce particles. As shown in FIG. 4A and FIG. 4B, the gas etchants may pass through the upper flow-uniformization plate 211 and the lower flow-uniformization plate 212, the gap A between the pedestal 209 and the first liner 401, the gap B between the first liner 401 and the second liner 402, and the gap between the second liner 402 and the sidewalls of the reaction chamber body 201 to enter the vacuum system (the pressure regulating assembly). Then, the gas etchants may be extracted by the molecular pump 204 that is connected to the reaction chamber body 201. To satisfy the high-pressure requirement, the gap A between the pedestal 209 and the first liner 401 may be designed to be smaller than 2 mm. The gap B between the first liner 401 and the second liner 402 may also be designed to be smaller than 2 mm, where A<B. For example, A=1.5 mm, B=2 mm, so that less gas etchants may enter the region under the pedestal 209 to ensure a desired utilization efficiency of the gas etchants.

In one embodiment, the gas intake 202 may pass a dehydrated hydrogen fluoride gas and a dehydrated alcohol gas into the reaction chamber 203. The dehydrated hydrogen fluoride gas and the dehydrated alcohol gas may be mixed to produce gas etchants to remove the $SiO_2$ on the workpiece.

In one embodiment, the gas etchants may be produced by mixing a dehydrated HF gas and a methanol ($CH_3OH$) gas. Specifically, when the methanol ($CH_3OH$) gas is used, the chemical reaction formula for the gas phase etching device may be expressed as:

$$HF+CH_3OH \rightarrow HF_2^- + CH_3OH_2^+ \qquad (1)$$

$$HF_2^- + CH_3OH_2^+ + SiO_2 \rightarrow SiF_4 + CH_3OH + H_2O \qquad (2)$$

The dehydrated HF gas and the dehydrated $CH_3OH$ gas are mixed to produce the gas etchants $HF_2^-$ and $CH_3OH_2^+$. Then, the gas etchants $HF_2^-$ and $CH_3OH_2^+$ are mixed with $SiO_2$ to produce $SiF_4$, $CH_3OH$, and $H_2O$.

For example, during the process, the workpiece may be transferred from a transfer chamber to the reaction chamber 203. The second temperature regulator 207 may regulate the temperature of the pedestal 209, such that a temperature of the workpiece may be regulated to approximately between 20° C. and 60° C. The first temperature regulator 208 may regulate the temperature of the reaction chamber 203 and other structures to approximately between 50° C. and 90° C. After the temperature of the reaction chamber 203 and the temperature of the workpiece are stabilized, the pedestal 209 may be raised to an operation position. Then, the dehydrated HF gas and the dehydrated $CH_3OH$ gas are flowed in and mixed to produce the gas etchants $HF_2^-$ and $CH_3OH_2^+$. During the process, the pressure regulator 206 may regulate the pressure inside the reaction chamber 203 to approximately between 30 Torr and 300 Torr. For example, the pressure inside the reaction chamber 203 may be regulated to about 200 Torr, the temperature inside the reaction chamber 203 may be regulated to about 70° C., and the temperature of the pedestal may be regulated to about 40° C.

In one embodiment, a flow rate of the hydrogen fluoride gas may be approximately between 100 sccm and 500 sccm, and a flow rate of the alcohol gas may be approximately between 100 sccm and 1000 sccm. For example, the flow rate of the hydrogen fluoride gas may be approximately between 150 sccm and 225 sccm, and the flow rate of the alcohol gas may be approximately between 200 sccm and 450 sccm.

In one embodiment, a flow ratio of the hydrogen fluoride gas to the alcohol gas may be approximately 0.8~1.2:1. For example, the flow ratio of the hydrogen fluoride gas to the alcohol gas may be approximately 1:1.

In one embodiment, the alcohol gas may be at least one of C1-C8 monohydric alcohol gases. For example, the alcohol gas may be at least one of a methanol gas, an ethanol gas, or an isopropyl alcohol gas.

Figure 5:
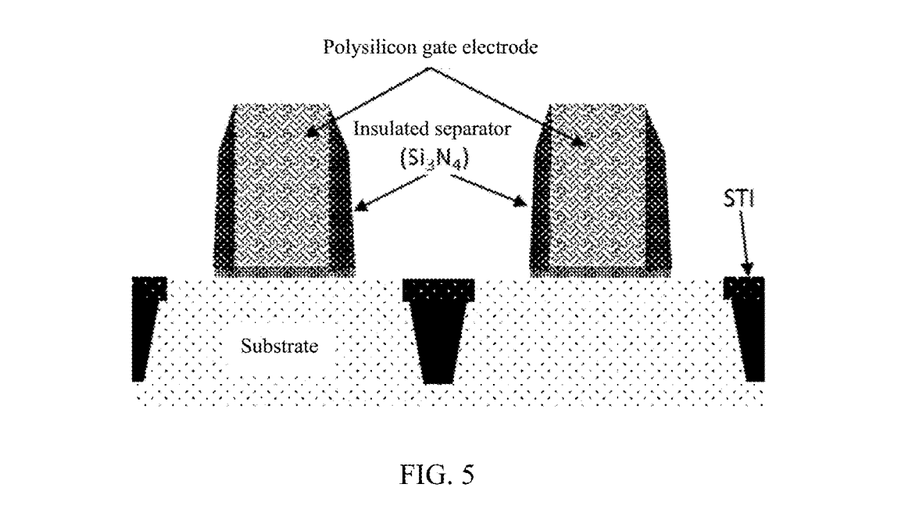
FIG. 5 illustrates a schematic view of a device after a natural oxidation layer is removed according to some embodiments of the present disclosure.

FIG. 5 illustrates a schematic view of a device after a natural oxidation layer is removed according to some embodiments of the present disclosure. Compared to the existing technology, when the gas phase etching device according to the present disclosure removes a naturally oxidized $SiO_2$ layer, the by-products of the reaction may not be in the solid state, and thus may be pumped out. As such, the process no longer needs the annealing process. The annealing process may be omitted. Moreover, because the by-products of the reaction are not in the solid state, the problem that the by-products in the solid state block small trenches in the existing technology may be avoided. Thus, the removal of the $SiO_2$ layer at bottoms of small trenches may be more effective, and the efficiency of removing the naturally oxidized $SiO_2$ layer may be improved. Further, because the reaction occurs at a low temperature (generally ≤40° C.), after the $SiO_2$ layer is removed, the workpiece no longer needs to be cooled and may be subject to a subsequent process directly. The gas phase etching device does not require the integration of the annealing function, a separate annealing chamber, or a separate cooling chamber. Thus, the structures are simplified, the process route is shortened, the production cost is saved, and the production yield is increased. The single chamber structure (only the etching chamber is required, and the annealing chamber and the cooling chamber are not required) makes it possible for integrating with subsequent processes. That is, other devices required by the subsequent processes may be integrated together with the device into a single pedestal. As such, the use of the device is substantially flexible.

A water absorption feature of $CH_3OH$ may further reduce $HO_2$ residual on the surface of the workpiece. The relatively high pressure during the process may make it easier for the reaction gases to be absorbed by the surface of the workpiece and to react with the $SiO_2$ layer, thereby substantially increasing a removal rate and a removal uniformity of removing the $SiO_2$ layer on the surface of the workpiece.

The present disclosure also provides a gas phase etching equipment. The equipment may include a reaction device and a transfer device. The reaction device may be the gas phase etching device provided by the embodiments of the present disclosure. The transfer device may be connected to the reaction device, such that a workpiece such as a wafer may be transferred between the transfer device and the reaction device.

The gas phase etching device and the gas phase etching equipment according to the present disclosure may provide the following advantages.

(1) In the gas phase etching device and the gas phase etching equipment according to the present disclosure, the first temperature regulator is configured inside the reaction chamber and the second temperature regulator is configured on the pedestal to independently regulate the temperature of the reaction chamber and the temperature of the pedestal. The temperature inside the reaction chamber is regulated to the first temperature, which prevents the inner walls of the reaction chamber from being corroded. The temperature of the pedestal is regulated to the second temperature. The first temperature is greater than the second temperature. As such, after the etching process removes the oxidized layer such as the $SiO_2$ layer from the workpiece held by the pedestal, the temperature of the workpiece satisfies the temperature requirement for directly performing the subsequent process without being cooled. The integration of the annealing function into the etching chamber or the use of the separate annealing chamber are not required. Correspondingly, the separate cooling chamber is not required. The gas phase etching device and the gas phase etching equipment only require the etching chamber. Thus, the structures are simplified, the process route is shortened, the production cost is saved, and the production yield is increased. The single chamber structure (only the etching chamber is required, and the annealing chamber and the cooling chamber are not required) makes it possible for integrating with subsequent processes. That is, other devices required by the subsequent processes may be integrated together with the device into a single pedestal. As such, the use of the device is substantially flexible.

(2) The gas phase etching device and the gas phase etching equipment according to the present disclosure use the gas phase etching process. That is, instead of the plasma etching process used in the existing technology, the gas phase etching process is used to remove the $SiO_2$ layer on the surface of the workpiece. Thus, when the gas phase etching device and the gas phase etching equipment according to the present disclosure are used to remove the $SiO_2$ layer on the surface of the workpiece, no by-products of the reaction in the solid state are produced. The problem that the by-products of the reaction in the solid state block the small trenches in the existing technology is avoided. Thus, the removal of the $SiO_2$ layer at the bottoms of the small trenches may be more effective, and the efficiency of removing the naturally oxidized $SiO_2$ layer may be improved.

(3) Further, when the gas phase etching device and the gas phase etching equipment according to the present disclosure remove the $SiO_2$ layer on the surface of the workpiece, the etching process is performed under the high pressure (e.g., the pressure inside the reaction chamber is approximately between 30 Torr and 300 Torr). As such, the etchants are more likely to be absorbed by the surface of the workpiece such as a silicon wafer to expedite the reaction rate and to increase the etching selectivity.

Figure 10:
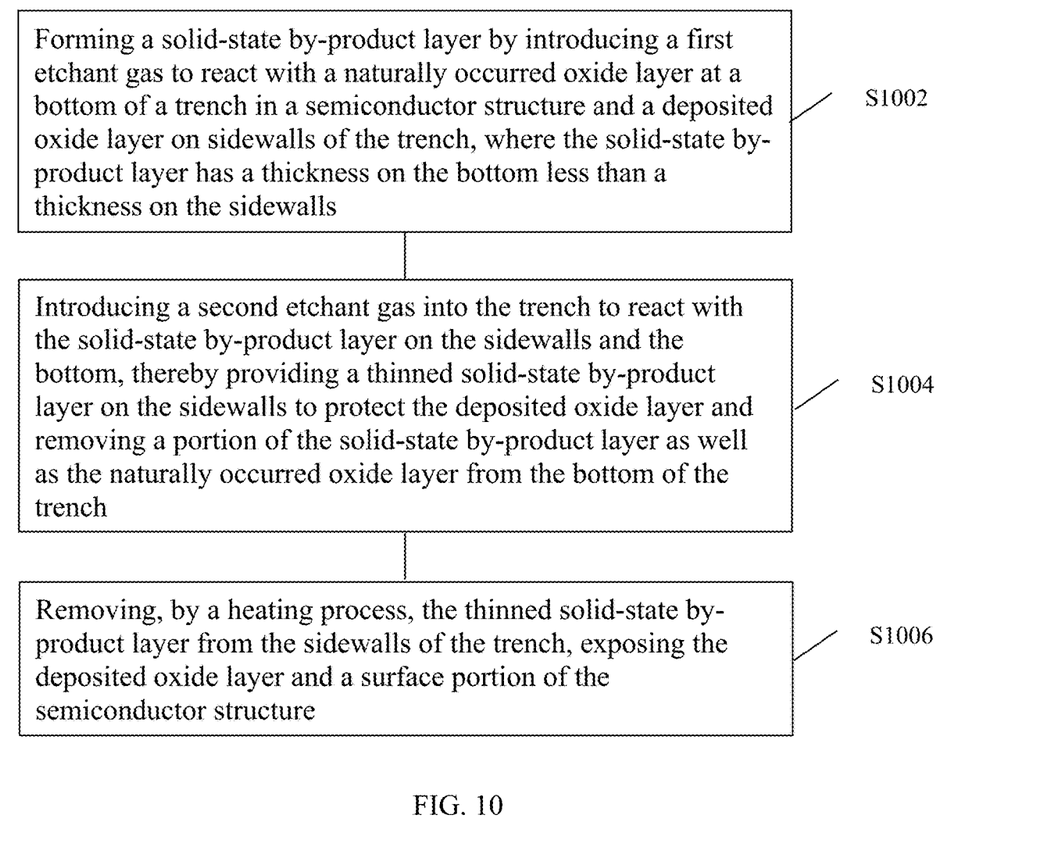
FIG. 10 illustrates an exemplary semiconductor manufacturing process according to some embodiments of the present disclosure.

FIG. 10 illustrates an exemplary semiconductor manufacturing process according to some embodiments of the present disclosure.

At S1002: forming a solid-state by-product layer by introducing a first etchant gas to react with a naturally occurred oxide (e.g., $SiO_2$) layer at a bottom of a trench (also referred to as device trench) in a semiconductor structure and a deposited oxide (e.g., chemically deposited SiO2) layer on sidewalls of the trench. The solid-state by-product layer has a thickness on the bottom less than a thickness on the sidewalls. In various embodiments, the trench has an aspect ratio, for example, ranging from about 30 to about 120.

In one embodiment, the first etchant gas includes the HF gas and the $NH_3$ gas. The chemical reaction for the gas phase etching process may be as the following:

$$HF+NH_3+SiO_2 \rightarrow (NH_4)_2SiF_6+H_2O \quad (3)$$

In one embodiment, the gas phase etching process, the reaction chamber pressure is approximately between 30 Torr and 300 Torr. For example, the reaction chamber pressure is approximately 200 Torr. The reaction chamber temperature is approximately between 50° C. and 90° C., and the pedestal temperature is approximately between 20° C. and 60° C. For example, the reaction chamber temperature is approximately 70° C., and the pedestal temperature is approximately 40° C. The flow rate of the HF gas is approximately between 50 sccm and 500 sccm, and the flow rate of the $NH_3$ gas is approximately between 50 sccm and 1000 sccm. For example, the flow rate of the HF gas is approximately between 150 sccm and 225 sccm, and the flow rate of the $NH_3$ gas is approximately between 200 sccm and 450 sccm. The flow ratio of the HF gas to the $NH_3$ gas is approximately 0.8~1.2:1. For example, the flow ratio of the HF gas to the $NH_3$ gas is approximately 1:1. The duration of the process is approximately between 20 s and 900 s. The removed thickness of the oxide layer is approximately between 1 nm and 200 nm. The solid-state by-product is $(NH_4)_2SiF_6$.

At S1004: introducing a second etchant gas into the trench to react with the solid-state by-product layer on the sidewalls and the bottom, thereby providing a thinned solid-state by-product layer on the sidewalls to protect the deposited oxide (e.g., chemically deposited $SiO_2$) layer and removing a portion of the solid-state by-product layer as well as the naturally occurred oxide layer from the bottom of the trench.

In one embodiment, the second etchant gas includes the dehydrated HF gas and the dehydrated $CH_3OH$ gas. The chemical reaction process is similar to the process described in the gas phase etching device and will not be repeated herein. The duration of the process is approximately between 20 s and 600 s. The removed thickness of the oxide (e.g., $SiO_2$) layer is approximately between 1 nm and 200 nm.

Because the sidewalls of the trench are covered by the solid-state by-product $(NH_4)_2SiF_6$ from the previous etching process, the deposited oxide (e.g., chemically deposited $SiO_2$) layer on the sidewalls of the trench is protected, the damage to the oxide layer on the sidewalls of the trench is reduced, and the leakage current is reduced. The solid-state by-product $(NH_4)_2SiF_6$ layer on the sidewalls of the trench reduces the effective opening of the trench. As such, the solid-state by-product $(NH_4)_2SiF_6$ layer on the sidewalls of the trench is thicker than the solid-state by-product $(NH_4)_2SiF_6$ layer at the bottom of the trench, the second etchant gas is more effective in removing the oxide layer at the bottom than the oxide layer on the sidewalls. Thus, the efficiency of removing the oxide layer at the bottom of the trench is increased.

At S1006, removing, by a heating process, the thinned solid-state by-product layer from the sidewalls of the trench, exposing the deposited oxide (e.g., chemically deposited $SiO_2$) layer and a surface portion of the semiconductor structure in the trench.

In one embodiment, the chamber temperature is raised to approximately between 100° C. and 200° C., causing the solid-state by-product $(NH_4)_2SiF_6$ to vaporize. The chemical reaction may be as the following:

$$(NH_4)_2SiF_6 \rightarrow SiF_4+NH_3 \quad (4)$$

In one embodiment, the workpiece is cooled in a vacuum state to prepare for a subsequent process.

In one embodiment, the subsequent process is a metal deposition process. The subsequent process may be conducted in the current chamber in the vacuum state. Alternatively, the workpiece may be transferred within a short period of time from the current same chamber filled with a nitrogen gas to a different chamber in the vacuum state for the metal deposition process. For example, a TiN adhesion layer is deposited by an atomic layer deposition (ALD) process. In one embodiment, $TiCl_4$ gas and $NH_3$ gas are introduced alternately to deposit the TiN film at a temperature approximately between 400° C. and 550° C. The purge gas may be $N_2$ or an inert gas. The process flow includes: 0.1 s-1.0 s $TiCl_4$ Pulse; 1.0 s-3.0 s $N_2$ Purge; 2.0 s-5.0 s $NH_3$ Pulse; followed by 1.0 s-3.0 s $N_2$ Purge. In an exemplary embodiment, after introducing the $TiCl_4$ gas for approximately between 0.1 second and 1.0 second, the purge gas is introduced in the vacuum chamber for deposition for approximately between 1.0 second and 3.0 seconds. This is followed by introducing the $NH_3$ gas for approximately between 2.0 seconds and 5.0 seconds and purging the vacuum chamber for approximately between 1.0 second and 3.0 seconds.

The manufacturing process according to the present disclosure may provide the following advantages.

For example, in the gas phase etching device and the gas phase etching equipment according to the present disclosure, the first temperature regulator is configured inside the reaction chamber and the second temperature regulator is configured on the pedestal to independently regulate the temperature of the reaction chamber and the temperature of the pedestal. The temperature inside the reaction chamber is regulated to the first temperature, which prevents the inner walls of the reaction chamber from being corroded. The temperature of the pedestal is regulated to the second temperature. The first temperature is greater than the second temperature. As such, after the etching process removes the oxidized layer such as the $SiO_2$ layer from the workpiece held by the pedestal, the temperature of the workpiece satisfies the temperature requirement for directly performing the subsequent process without being cooled. The integration of the annealing function into the etching chamber or the use of the separate annealing chamber are not required. Correspondingly, the separate cooling chamber is not required. The gas phase etching device and the gas phase etching equipment only require the etching chamber. Thus, the structures are simplified, the process route is shortened, the production cost is saved, and the production yield is increased. The single chamber structure (only the etching chamber is required, and the annealing chamber and the cooling chamber are not required) makes it possible for integrating with subsequent processes. That is, other devices required by the subsequent processes may be integrated together with the device into a single pedestal. As such, the use of the device is substantially flexible.

Further, the gas phase etching device and the gas phase etching equipment according to the present disclosure use the gas phase etching process. That is, instead of the plasma etching process used in the existing technology, the gas phase etching process is used to remove the oxide (e.g.,

$SiO_2$) layer on the surface of the workpiece. Thus, when the gas phase etching device and the gas phase etching equipment according to the present disclosure are used to remove the oxide (e.g., $SiO_2$) layer on the surface of the workpiece, no by-products of the reaction in the solid state are produced. The problem that the by-products of the reaction in the solid state block the small trenches in the existing technology is avoided. Thus, the removal of the oxide (e.g., $SiO_2$) layer at the bottoms of the small trenches may be more effective, and the efficiency of removing the naturally oxidized layer may be improved.

Further, when the gas phase etching device and the gas phase etching equipment according to the present disclosure remove the oxide (e.g., $SiO_2$) layer on the surface of the workpiece, the etching process is performed under the high pressure (e.g., the pressure inside the reaction chamber is approximately between 30 Torr and 300 Torr). As such, the etchants are more likely to be absorbed by the surface of the workpiece such as a silicon wafer to expedite the reaction rate and to increase the etching selectivity.

Figure 6:
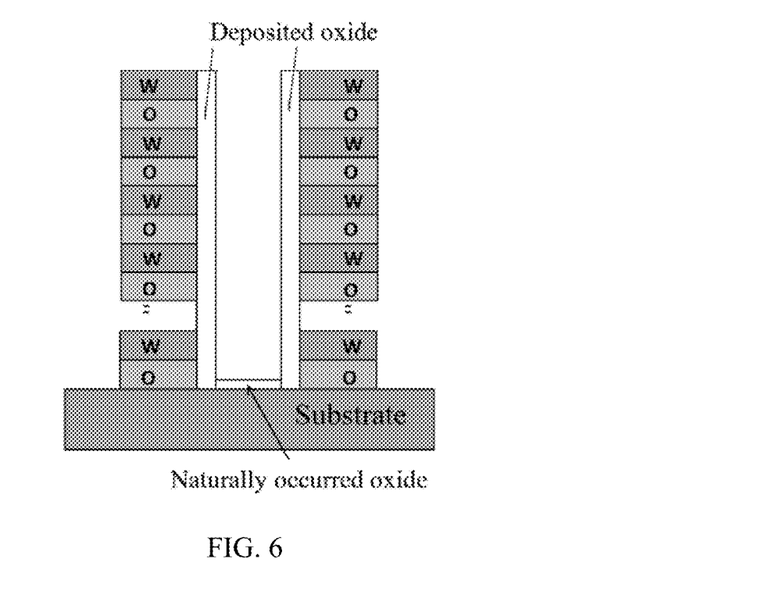
FIGS. 6-9 illustrates a schematic view of a portion of a semiconductor structure containing a trench at certain stages during its manufacturing process according to some embodiments of the present disclosure.

FIG. 6 illustrates a schematic view of a device trench having sidewalls covered by a deposited oxide layer according to some embodiments of the present disclosure. To insulate between different functional layers, an oxide (e.g., $SiO_2$) layer may be deposited on sidewalls of trenches of the semiconductor structure. The deposited oxide (e.g., chemically deposited $SiO_2$) layer on the sidewalls is often less dense than the naturally oxidized $SiO_2$ layer on the bottom of the same trench. The manufacturing process described above may remove the oxide layer on the sidewalls more than the oxide layer on the bottoms. When the oxide (e.g., $SiO_2$) layer on the surface of the workpiece is removed by the gas phase etching device, the oxide (e.g., $SiO_2$) layer on sidewalls of a trench in a semiconductor structure may be removed as well, thereby resulting in leakage currents between functional layers. To protect the sidewalls from over-etching, the workpiece may be pre-treated to cover the sidewalls with a solid-state by-product layer.

In one embodiment, the semiconductor structure may be a three-dimensional NAND structure.

In one embodiment, as shown in FIG. 2, the gas intake 202 may pass a dehydrated $NF_3$ gas and a dehydrated $NH_3$ gas into the reaction chamber 203. The dehydrated $NF_3$ gas and the dehydrated $NH_3$ gas may be mixed as gas etchants to remove the $SiO_2$ on the workpiece and may cover the sidewalls and the bottoms with a solid-state by-product $(NH_4)_2 SiF_6$ layer. For example, the chemical reactions for the gas phase etching device may be as the following:

$$NF_3 + NH_3 + SiO_2 \rightarrow (NH_4)_2SiF_6 + H_2O \quad (5)$$

For example, during the process, the workpiece may be transferred from the transfer chamber to the reaction chamber 203. The second temperature regulator 207 may regulate the temperature of the pedestal 209, such that the temperature of the workpiece may be regulated to approximately between 20° C. and 60° C. The first temperature regulator 208 may regulate the temperature of the reaction chamber 203 and other structures to approximately between 50° C. and 90° C. After the temperature of the reaction chamber 203 and the temperature of the workpiece are stabilized, the pedestal 209 may be raised to the operation position. Then, the dehydrated $NF_3$ gas and the dehydrated $NH_3$ gas are flowed in at a flow rate approximately between 50 sccm and 1000 sccm and are mixed to remove the $SiO_2$ on the workpiece and to cover the sidewalls and the bottoms with the solid-state by-product $(NH_4)_2 SiF_6$ layer. During the process, the pressure regulator 206 may regulate the pressure inside the reaction chamber 203 to approximately between 0.3 Torr and 3 Torr. The pre-treatment process may last approximately between 20 seconds and 900 seconds, and the $SiO_2$ layer of a thickness approximately between 1 nm and 200 nm may be removed.

In one embodiment, as shown in FIG. 2, the gas intake 202 may pass a dehydrated HF gas and the dehydrated $NH_3$ gas into the reaction chamber 203. The dehydrated HF gas and the dehydrated $NH_3$ gas may be mixed as gas etchants to remove the $SiO_2$ on the workpiece and to cover the sidewalls and the bottoms with the solid-state by-product $(NH_4)_2 SiF_6$ layer.

For example, during the process, the workpiece may be transferred from the transfer chamber to the reaction chamber 203. The second temperature regulator 207 may regulate the temperature of the pedestal 209, such that the temperature of the workpiece may be regulated to approximately between 20° C. and 60° C. The first temperature regulator 208 may regulate the temperature of the reaction chamber 203 and other structures to approximately between 50° C. and 90° C. After the temperature of the reaction chamber 203 and the temperature of the workpiece are stabilized, the pedestal 209 may be raised to the operation position. Then, the dehydrated HF gas is flowed in at a flow rate approximately between 50 sccm and 500 sccm and the dehydrated $NH_3$ gas is flowed in at a flow rate approximately between 50 sccm and 1000 sccm. The dehydrated HF gas and the dehydrated $NH_3$ gas are mixed to remove the $SiO_2$ on the workpiece and to cover the sidewalls and the bottoms with the solid-state by-product $(NH_4)_2 SiF_6$ layer. During the process, the pressure regulator 206 may regulate the pressure inside the reaction chamber 203 to approximately between 0.3 Torr and 3 Torr. The pre-treatment process may last approximately between 20 seconds and 900 seconds, and the $SiO_2$ layer of a thickness approximately between 1 nm and 200 nm may be removed. The duration of the pre-treatment may be adjusted to prevent the trench form being blocked.

Figure 7:
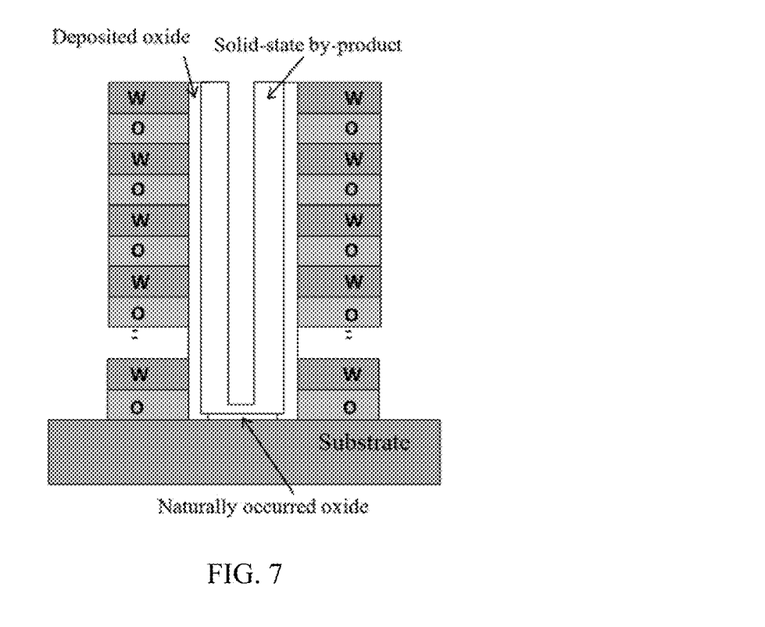

In one embodiment, unlike the existing technology, the by-product $(NH_4)_2 SiF_6$ layer may not be removed by heating the workpiece to approximately between 110° C. and 200° C. Instead, the by-product $(NH_4)_2 SiF_6$ layer serves a protection layer for the $SiO_2$ layer on the sidewalls in the subsequent gas phase etching process. Removal of one-unit thickness of the $SiO_2$ layer may produce three-unit thickness of the by-product $(NH_4)_2 SiF_6$ layer. As such, as shown in FIG. 7, when a trench diameter is smaller than six times an etching thickness, the trench may be blocked by the solid-state by-product layer. The etchant gas may not enter the trench to remove the naturally occurred $SiO_2$ layer at the bottom of the trench. That is, an effective trench diameter may be reduced by six times the etching thickness when the effective trench diameter is greater than six times the etching thickness. Thus, the etching gas may be less likely to reach the bottom of the trench to remove the $SiO_2$ layer.

In one embodiment after the workpiece is pre-treated, another gas phase process may be performed to remove the $SiO_2$ layer. As shown in FIG. 2, the gas intake 202 may pass a dehydrated hydrogen fluoride gas and a dehydrated alcohol gas into the reaction chamber 203. The dehydrated hydrogen fluoride gas and the dehydrated alcohol gas may be mixed to produce gas etchants to remove the $SiO_2$ on the workpiece.

In one embodiment, the gas etchants may be produced by mixing a dehydrated HF gas and a dehydrated methanol ($CH_3OH$) gas. The dehydrated HF gas and the dehydrated $CH_3OH$ gas are mixed to produce the gas etchants $HF_2^-$ and $CH_3OH_2^+$. Then, the gas etchants $HF_2^-$ and $CH_3OH_2^+$ are mixed with $SiO_2$ to produce $SiF_4$, $CH_3OH$, and $H_2O$.

For example, during the process, the workpiece may be transferred from the transfer chamber to the reaction chamber 203. The second temperature regulator 207 may regulate the temperature of the pedestal 209, such that the temperature of the workpiece may be regulated to approximately between 20° C. and 60° C. The first temperature regulator 208 may regulate the temperature of the reaction chamber 203 and other structures to approximately between 50° C. and 90° C. After the temperature of the reaction chamber 203 and the temperature of the workpiece are stabilized, the pedestal 209 may be raised to the operation position. Then, the dehydrated HF gas and the dehydrated $CH_3OH$ gas are flowed in and mixed to produce the gas etchants $HF_2^-$ and $CH_3OH_2^+$. During the process, the pressure regulator 206 may regulate the pressure inside the reaction chamber 203 to approximately between 5 Torr and 250 Torr.

In one embodiment, a flow rate of the hydrogen fluoride gas may be approximately between 50 sccm and 500 sccm, and a flow rate of the alcohol gas may be approximately between 50 sccm and 2000 sccm. The pre-treatment process may last approximately between 20 seconds and 600 seconds, and the $SiO_2$ layer of a thickness approximately between 1 nm and 200 nm may be removed. Under the disclosed conditions of the process, the products resulted from the chemical reaction $SiF_4$, $CH_3OH$ and $H_2O$ are all in the gas state and may not reduce the effective diameter of the trench.

In one embodiment, as shown in FIG. 7, because the $SiO_2$ layer on the sidewalls of the trench is protected by the solid-state by-product $(NH_4)_2$ $SiF_6$ layer, damage to the $SiO_2$ layer on the sidewalls of the trench may be reduced, and the leakage currents between different functional layers may be minimized. Due to the presence of the solid-state by-product $(NH_4)_2$ $SiF_6$ layer, the effective diameter of the trench is reduced, and the solid-state by-product $(NH_4)_2$ $SiF_6$ layer at the bottom of the trench is thinner than the solid-state by-product $(NH_4)_2$ $SiF_6$ layer on the sidewalls of the trench. As such, the dehydrated HF gas and the dehydrated $CH_3OH$ gas are more likely to penetrate the solid-state by-product $(NH_4)_2$ $SiF_6$ layer at the bottom of the trench than the solid-state by-product $(NH_4)_2$ $SiF_6$ layer on the sidewalls of the trench. Thus, the efficiency of removing the $SiO_2$ layer at the bottom of the trench may be improved.

Figure 8:
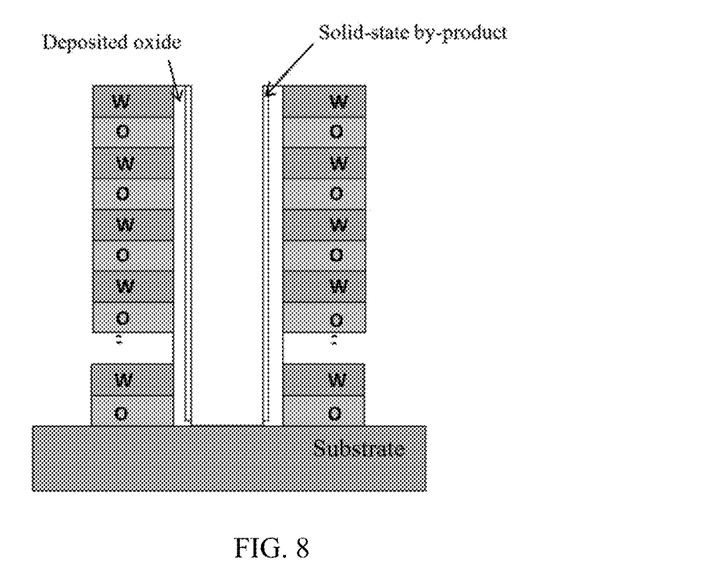
Figure 9:
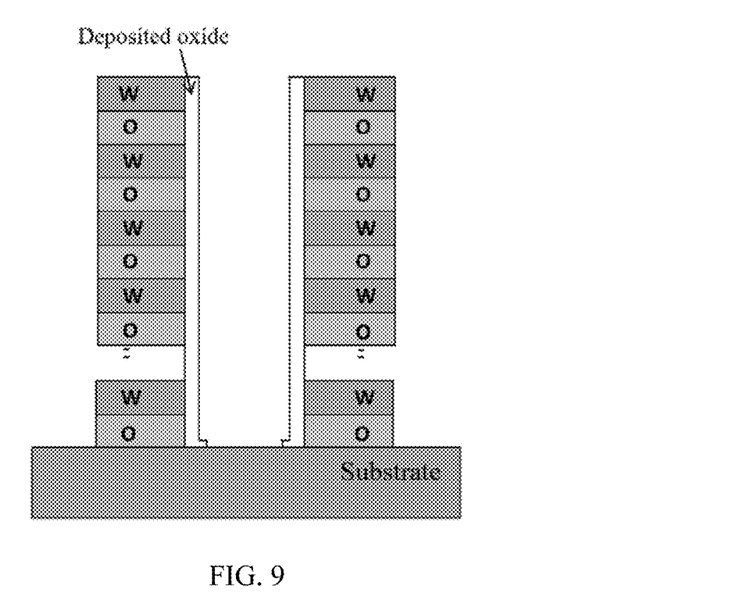

In one embodiment, as shown in FIG. 8, after the $SiO_2$ layer at the bottom of the trench is removed, a thinned solid-state by-product layer may still exist on the sidewalls of the trench. The workpiece may be heated to a temperature approximately between 110° C. and 200° C. to remove residuals of the solid-state by-product $(NH_4)_2$ $SiF_6$ layer. As such, as shown in FIG. 9, the naturally occurred $SiO_2$ layer at the bottom of the trench has been removed without damaging the chemically deposited $SiO_2$ layer on the sidewalls of the trench. Then, the workpiece may be cooled under the vacuum condition for the subsequent metal deposition process. The workpiece may be cooled in the same reaction chamber 203 or may be transferred to another different reaction chamber under the nitrogen filled condition within a short period of time.

The manufacturing process according to the present disclosure may provide the following advantages.

For example, when the gas phase etching device and the gas phase etching equipment according to the present disclosure remove the oxide (e.g., $SiO_2$) layer on the surface of the workpiece, the etching process is performed under the high pressure (e.g., the pressure inside the reaction chamber is approximately between 30 Torr and 300 Torr). As such, the etchants are more likely to be absorbed by the surface of the workpiece such as a silicon wafer to expedite the reaction rate and to increase the etching selectivity.

Further, the gas phase etching device and the gas phase etching equipment according to the present disclosure remove the oxide (e.g., $SiO_2$) layer on the surface of the workpiece at the bottoms of the trenches and trenches with a high depth-to-width ratio. As such, the damage to the oxide (e.g., $SiO_2$) layer on the sidewalls of the trench may be reduced and the leakage currents between different functional layers may be minimized.

The manufacturing process disclosed herein may be used to process any IC semiconductor structures, for example, to efficiently remove trench bottom silicon oxide and reduce/eliminate sidewall damages of trenches in the semiconductor structures.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A semiconductor manufacturing process, comprising:
forming a trench in a semiconductor structure;
depositing an oxide layer on sidewalls of the trench;
forming a solid-state by-product layer on surfaces of a bottom and the sidewalls of the trench by introducing a first etchant gas to react with a naturally occurred oxide layer at the bottom of the trench and the deposited oxide layer on the sidewalls of the trench, wherein the solid-state by-product layer has a thickness on the bottom less than a thickness on the sidewalls;
introducing a second etchant gas into the trench to react with the solid-state by-product layer on the bottom and the sidewalls, thereby removing the naturally occurred oxide layer and a portion of the solid-state by-product layer from the bottom of the trench and providing a thinned solid-state by-product layer on the sidewalls to protect the deposited oxide layer; and
removing, by a heating process, the thinned solid-state by-product layer from the sidewalls of the trench, exposing the deposited oxide layer and a surface portion of the semiconductor structure in the trench.

2. The process according to claim 1, further including:
after the heating process, vacuum-cooling the semiconductor structure in a vacuum chamber.

3. The process according to claim 2, further including:
after vacuum-cooling the semiconductor structure, performing a metal deposition process: in a same vacuum chamber or in a different vacuum chamber after transferring the semiconductor structure under a nitrogen-containing environment to the different vacuum chamber.

4. The process according to claim 3, wherein the metal deposition process includes:
depositing a TiN layer by an atomic layer deposition.

5. The process according to claim 4, wherein the depositing of the TiN layer includes:

alternately introducing TiCl$_4$ gas and NH$_3$ gas at a temperature approximately between 400° C. and 550° C., wherein a purge gas includes nitrogen or an inert gas.

6. The process according to claim 5, further including:
introducing the TiCl$_4$ gas for approximately between 0.1 second and 1.0 second;
purging for approximately between 1.0 second and 3.0 seconds;
introducing the NH$_3$ gas for approximately between 2.0 seconds and 5.0 seconds; and
purging for approximately between 1.0 second and 3.0 seconds.

7. The process according to claim 1, wherein:
the trench has an aspect ratio ranging from about 30 to about 120.

8. The process according to claim 1, wherein:
the first etchant gas is introduced into a reaction chamber containing the semiconductor structure, and includes a dehydrated HF gas and a dehydrated NH$_3$ gas;
the second etchant gas is introduced into the reaction chamber and includes a dehydrated HF gas and a dehydrated CH$_3$OH gas; and
the semiconductor structure is held by a pedestal in the reaction chamber.

9. The process according to claim 8, wherein the thinned solid-state by-product layer includes (NH$_4$)$_2$SiF$_6$.

10. The process according to claim 9, wherein:
a pressure in the reaction chamber is approximately between 0.3 Torr and 3.0 Torr;
a temperature in the reaction chamber is approximately between 50° C. and 90° C.;
a pedestal temperature is approximately between 20° C. and 60° C.;
a flow rate of the HF gas is approximately between 50 sccm and 500 sccm;
a flow rate of the NH$_3$ gas is approximately between 50 sccm and 1000 sccm;
a process duration is approximately between 20s and 900s; and
a removed thickness of the oxide layer at the bottom of the trench is approximately between 1 nm and 200 nm.

11. The process according to claim 8, wherein introducing the second etchant gas into the trench to react with the solid-state by-product layer includes introducing the dehydrated HF gas and the dehydrated CH$_3$OH gas to produce HF$_2^-$ and CH$_3$OH$_2^+$ in gas phase to react with the naturally occurred oxide layer and the portion of the solid-state by-product layer to be removed.

12. The process according to claim 11, wherein:
a pressure in the reaction chamber is approximately between 30 Torr and 300 Torr;
a temperature in the reaction chamber is approximately between 50° C. and 90° C.;
a pedestal temperature is approximately between 20° C. and 60° C.;
a flow rate of the HF gas is approximately between 100 sccm and 500 sccm;
a flow rate of the NH$_3$ gas is approximately between 100 sccm and 1000 sccm;
a process duration is approximately between 20s and 600s; and
a removed thickness of the oxide layer at the bottom of the trench is approximately between 1 nm and 200 nm.

13. The process according to claim 12, wherein:
the reaction chamber includes a dry pump and a molecular pump;
the dry pump regulates a humidity in the reaction chamber; and
the molecular pump extracts reaction by-products from the reaction chamber after the manufacturing process is completed.

14. The process according to claim 1, wherein in the heating process,
the semiconductor structure is heated at a temperature ranging from about 110° C. to about 200° C.

15. The process according to claim 1, wherein:
the semiconductor structure includes a three-dimensional NAND structure.

16. The process according to claim 1, further including:
forming a conductive plug on the surface portion of the semiconductor structure at the bottom of the trench and on the deposited oxide layer on the sidewalls of the trench.

* * * * *